(12) United States Patent
Okazaki et al.

(10) Patent No.: US 11,293,548 B2
(45) Date of Patent: Apr. 5, 2022

(54) SLIDING MEMBER AND COATING FILM

(71) Applicants: NIPPON PISTON RING CO., LTD., Saitama (JP); NIPPON ITF, INC., Kyoto (JP)

(72) Inventors: Takahiro Okazaki, Saitama (JP); Yoshihiro Ito, Saitama (JP); Hiroyuki Sugiura, Saitama (JP); Shinya Kanazawa, Saitama (JP); Hideki Moriguchi, Kyoto (JP); Akinori Shibata, Kyoto (JP); Takehiko Ooshiro, Kyoto (JP)

(73) Assignees: NIPPON PISTON RING CO., LTD, Saitama (JP); NIPPON ITF, INC, Kyoto (JP)

( * ) Notice: Subject to any disclaimer, the term of this patent is extended or adjusted under 35 U.S.C. 154(b) by 123 days.

(21) Appl. No.: 16/624,781

(22) PCT Filed: Jun. 15, 2018

(86) PCT No.: PCT/JP2018/023026
§ 371 (c)(1),
(2) Date: Dec. 19, 2019

(87) PCT Pub. No.: WO2018/235750
PCT Pub. Date: Dec. 27, 2018

(65) Prior Publication Data
US 2020/0217416 A1    Jul. 9, 2020

(30) Foreign Application Priority Data
Jun. 20, 2017  (JP) .............................. JP2017-120461

(51) Int. Cl.
*F16J 9/26*     (2006.01)
*C01B 32/05*    (2017.01)
(Continued)

(52) U.S. Cl.
CPC ................. *F16J 9/26* (2013.01); *C01B 32/05* (2017.08); *C23C 14/16* (2013.01); *C23C 14/32* (2013.01); *C01P 2004/04* (2013.01)

(58) Field of Classification Search
CPC ...... F16J 9/26; C01P 2004/04; C23C 14/0605
(Continued)

(56) References Cited

U.S. PATENT DOCUMENTS 6,562,445 B2  5/2003 Iwamura
8,999,604 B2  4/2015 Iseki et al.
(Continued)

FOREIGN PATENT DOCUMENTS

JP  10-87396 A    4/1998
JP  2001-261318 A  9/2001
(Continued)

OTHER PUBLICATIONS

International Search Report of PCT/JP2018/023026 dated Aug. 7, 2018 [PCT/ISA/210].
(Continued)

*Primary Examiner* — Archene A Turner
(74) *Attorney, Agent, or Firm* — Sughrue Mion, PLLC

(57) ABSTRACT

A sliding member (10) including a coating film (1) composed of a hard carbon layer on a sliding surface (16) of a base material (11). The coating film has, when a cross section thereof is observed by a bright-field TEM image, a thickness within a range of 1 μm to 50 μm, and is configured by repeating units including black hard carbon layers (B), relatively shown in black, and white hard carbon layers (W), relatively shown in white, and laminated in a thickness direction, and comprise an inclined region, provided on a base material side, where thicknesses of white hard carbon layers (W) of the repeating units gradually increase in a thickness direction, and a homogeneous region\, provided on
(Continued)

a surface side of the sliding member, where thicknesses of the white hard carbon layers (W) of the repeating units are the same or substantially the same in the thickness direction.

7 Claims, 5 Drawing Sheets

(51) Int. Cl.
    *C23C 14/16*     (2006.01)
    *C23C 14/32*     (2006.01)

(58) Field of Classification Search
    USPC .......................................................... 428/408
    See application file for complete search history.

(56) References Cited

U.S. PATENT DOCUMENTS

| | | |
|---|---|---|
| 9,086,148 B2 | 7/2015 | Kennedy |
| 2001/0031346 A1 | 10/2001 | Iwamura |
| 2009/0011225 A1 | 1/2009 | Moronuki et al. |
| 2012/0183887 A1 | 7/2012 | Iseki et al. |
| 2013/0140776 A1 | 6/2013 | Kennedy |
| 2015/0072126 A1* | 3/2015 | Sakurai ................... C23C 28/34 428/216 |
| 2015/0292622 A1 | 10/2015 | Kennedy et al. |
| 2016/0238133 A1* | 8/2016 | Sato .................... C23C 14/0664 |
| 2017/0306257 A1 | 10/2017 | Moriguchi et al. |
| 2018/0245200 A1* | 8/2018 | Shinohara ............. F16C 33/043 |
| 2018/0371608 A1* | 12/2018 | Moriguchi ................. F16J 9/26 |
| 2019/0100434 A1 | 4/2019 | Moriguchi et al. |

FOREIGN PATENT DOCUMENTS

| | | |
|---|---|---|
| JP | 2002-327271 A | 11/2002 |
| JP | 2011-148686 A | 8/2011 |
| JP | 2013-528697 A | 7/2013 |
| WO | 2007/072658 A1 | 6/2007 |
| WO | 2013/120157 A1 | 8/2013 |
| WO | 2016/042629 A1 | 3/2016 |
| WO | 2017/043022 A1 | 3/2017 |
| WO | 2017/104822 A1 | 6/2017 |
| WO | 2017/163807 A1 | 9/2017 |

OTHER PUBLICATIONS

Written Opinion of PCT/JP2018/023026 dated Aug. 7, 2018 [PCT/ISA/237].
Extended European Search Report dated Sep. 15, 2020 in European Application No. 18820160.2.

* cited by examiner

SLIDING MEMBER AND COATING FILM

CROSS REFERENCE TO RELATED APPLICATIONS

This application is a National Stage of International Application No. PCT/JP2018/023026, filed Jun. 15, 2018, claiming priority to Japanese Patent Application No. 2017-120461, filed Jun. 20, 2017.

FIELD OF THE INVENTION

The present invention relates to a sliding member and a coating film. More specifically, the present invention relates to a sliding member including a coating film exhibiting constant and stable chipping resistance and wear resistance and excellent in peeling resistance (adhesion), and the coating film thereof.

BACKGROUND ART

In recent years, in various industrial fields, particularly in the automobile field, the study of hard carbon layers as coating films on surfaces of sliding members that require slidability, such as an engine base material or other machine base materials, is prevalent. The hard carbon layer is generally called by various names such as diamond-like carbon (DLC) film, amorphous carbon layer, i-carbon film, and diamond-like carbon layer. Such hard carbon layers are structurally classified as amorphous.

In the hard carbon layer, single bonds such as seen in diamond crystals, and double bonds such as seen in graphite crystals, are considered to co-exist. The hard carbon layer has properties such as high hardness, high wear resistance, and excellent chemical stability like the diamond crystals as well as properties such as low hardness, high lubricity, and excellent mated conformability like the graphite crystals. Further, the hard carbon layer, being amorphous, has excellent flatness, low frictionality (that is, a small friction coefficient) in direct contact with a mated material, and excellent mated conformability as well.

On a sliding surface of the sliding member, chipping resistance (defect resistance) and wear resistance are important properties. However, the chipping resistance (defect resistance) and wear resistance are in a trade-off relationship, making it difficult to provide a coating film that satisfies these. As means therefor, providing a hard carbon layer having low hardness, or providing a mixed film of a hard carbon having low hardness and a hard carbon having high hardness to achieve both chipping resistance and wear resistance has been studied.

Nevertheless, the present situation is that both chipping resistance and wear resistance are still not sufficiently achieved. In particular, even though a coating film provided to a sliding member such as a piston ring to which a high load is applied is required to have chipping resistance and wear resistance as well as low frictionality and peeling resistance, the present situation is that improvement of these properties is still insufficient.

In relation to improving the properties of the hard carbon layer, the hard carbon layers formed by chemical vapor deposition (CVD) methods described in Patent Documents 1 to 3, and the hard carbon layers formed by physical vapor deposition (PVD) methods described in Patent Documents 4 and 5 have been proposed. Specifically, Patent Document 1 proposes a hard carbon layer having high hardness, a low friction coefficient, and excellent sliding properties. This hard carbon layer has a surface roughness of Rmax 500 nm or less, and includes a diamond-structured cluster having 100 to 2,000 carbon atoms and a graphite-structured cluster having 100 to 2,000 carbon atoms at a ratio of 0.3 to 3.

Patent Document 2 proposes a conductive hard carbon film and a coating member thereof that have favorable wear resistance, oxidation resistance, and corrosion resistance, and are used in applications or processes in which there is contact between conductive members, or in a corrosive environment. This conductive hard carbon film has a structure in which at least a portion of $sp^2$-bonding crystals is continuously connected in a film thickness direction.

Patent Document 3 proposes an oriented amorphous carbon layer having a novel structure and exhibiting high conductivity, and a method for forming the same. This amorphous carbon layer is an oriented amorphous carbon layer containing C as a main component, and 3 to 20 atom % of N, more than 0 atom % and 20 atom % or less of H, and 70 atom % or more and less than 100 atom % of carbon ($Csp^2$) having a $sp^2$ hybridized orbital when the total amount of C is 100 atom %, and includes a graphite (002) surface oriented in a thickness direction. Then, it is proposed that this amorphous carbon layer can be formed by a direct current plasma CVD method in which a reactant gas containing one or more compound gases selected from carbocyclic compound gas containing $Csp^2$ and nitrogen-containing heterocyclic compound gas containing $Csp^2$ and nitrogen and/or silicon and nitrogen gas is discharged at −1,500 V or less.

Patent Document 4, which relates to a DLC film, proposes a coating film having excellent wear resistance, a low friction coefficient, and excellent sliding properties, and a member excellent in these same properties. This coating film is an amorphous structure containing carbon as a main component, and is a DLC hard multi-layered film in which a low-hardness hard carbon layer containing graphite clusters having an average diameter of 2 nm or more and a high-hardness hard carbon layer containing graphite clusters having an average diameter of 1 nm or less are alternately laminated.

Patent Document 5 proposes a slide element, in particular, a piston ring including a coating provided with an adhesive layer containing a metal, and a ta-C type DLC layer having a thickness of at least 10 μm, on at least one sliding surface, from an inner side toward an outer side.

PATENT DOCUMENTS

Patent Document 1: Japanese Laid-Open Patent Application No. H10-87396
Patent Document 2: Japanese Laid-Open Patent Application No. 2002-327271
Patent Document 3: Japanese Laid-Open Patent Application No. 2011-148686
Patent Document 4: Japanese Laid-Open Patent Application No. 2001-261318
Patent Document 5: Japanese Translation of PCT International Application No. 2013-528697

SUMMARY OF THE INVENTION

Problems to be Solved by the Invention

The techniques using the CVD methods described above are all insufficient in achieving both chipping resistance and wear resistance, and insufficient in improving low frictionality and peeling resistance as well. That is, in the film-forming methods using a CVD method, the film-forming temperature is high and a gas raw material containing hydrogen is further used, and therefore the formed hard carbon layer contains hydrogen. This hard carbon layer has low hardness and excellent chipping resistance, and has excellent durability because a thick film can be easily formed. However, the wear resistance is insufficient due to the low hardness and further the hard carbon layer contains hydrogen, and thus the low frictionality in oil are inferior compared to those of the hard carbon layer formed by a PVD method.

On the other hand, with a PVD method, because a solid carbon raw material is used in a cathode, the hydrogen content in the hard carbon layer can be set to 10 atom % or less, and hard carbon having high hardness without containing hydrogen and impurity metals and excellent in low frictionality in oil can be formed into a film. When a hard carbon layer is formed by a PVD method, $sp^3$-bonding carbon (diamond structure) is not readily generated when the base material temperature is high, and a hard carbon layer having low hardness and rich in $sp^2$-bonding carbon (graphite structure) is formed. Therefore, conventionally, film formation was performed at a base material temperature of 200° C. or less to form a hard carbon layer having a high $sp^3$-bonding carbon ratio and excellent wear resistance.

Nevertheless, when a hard carbon layer is formed by a PVD method, if an attempt is made to form a layer at a thickness exceeding 1 μm to secure sufficient durability, compressive residual stress in the hard carbon layer becomes excessively large and the film self-destructs. Even if not self-destructed, the hard carbon layer is in a state in which the compressive residual stress is large and strain is accumulated, and thus the chipping resistance is low. Thus, with a PVD method, it is difficult to stably form a thick hard carbon layer, and secure sufficient durability.

In particular, in a sliding member provided with a coating film having a thickness of at least several μm, for example, as a sliding member such as a piston ring to which a high load is applied, excellence in adhesion between the coating film and the base material is required. Further, the coating film on the surface side needs to exhibit the chipping resistance and the wear resistance in a stable and constant state, even when wear gradually advances.

The present invention has been made to solve the above-described problems, and an object of the present invention is to provide a sliding member including a coating film exhibiting constant and stable chipping resistance and wear resistance and excellent in peeling resistance (adhesion), and the coating film thereof.

Means for Solving the Problems

A sliding member according to the present invention is a sliding member comprising a coating film composed of a hard carbon layer on a sliding surface.

The coating film has, when a cross section thereof is observed by a bright-field transmission electron microscope (TEM) image, a thickness within a range of 1 μm to 50 μm, and is configured by repeating units including black hard carbon layers, relatively shown in black, and white hard carbon layers, relatively shown in white, and laminated in a thickness direction.

The coating film includes an inclined region, provided on a base material side, where thicknesses of the white hard carbon layers of the repeating units gradually increase in a thickness direction, and a homogeneous region, provided on a surface side, where thicknesses of the white hard carbon layers of the repeating units are the same or substantially the same in the thickness direction. The inclined region has a form grown into a V-shape or a radial pattern in the thickness direction, and the homogeneous region does not have a form grown into a V-shape or a radial pattern in the thickness direction.

The relatively white hard carbon layers each have low density and a high $sp^2/sp^3$ ratio, and are excellent in low frictionality and chipping resistance. The relatively black hard carbon layers each have high density and a low $sp^2/sp^3$ ratio, and are excellent in strength. According to this invention, the coating film includes the inclined region, on the base material side, where the thicknesses of the white hard carbon layers of the repeating units gradually increase (thicken) in the thickness direction and the thicknesses of the black hard carbon layers gradually decrease (thin) in the thickness direction and thus, due to this inclined region where a large number of black hard carbon layers having particularly high strength exist on the base material side, can be firmly adhered to the base material to increase adhesion. In particular, the inclined region has a form grown into a V-shape or a radial pattern in the thickness direction that is not found in the homogeneous region. Thus, a V-shaped or a radial structure and the black hard carbon layers are intertwined and adhesion increases, making it possible to improve peeling resistance (adhesion). Further, the coating film includes the homogeneous region, on the surface side, where the thicknesses of the white hard carbon layers of the repeating units are the same or substantially the same in the thickness direction. Thus, due to the existence of this homogeneous region of the white hard carbon layers particularly excellent in low frictionality and chipping resistance, the chipping resistance and the wear resistance can be exhibited in a stable and constant state, even when the wear of the coating film gradually advances.

In the sliding member according to the present invention, a thickness ratio of the black hard carbon layer to the white hard carbon layer (black thickness/white thickness) in the homogeneous region is 0.01 to 0.3. According to this invention, in the homogeneous region, the thickness ratio of the black hard carbon layer is low as in the above-described range, and a film with a white hard carbon layer being rich is laminated, making the chipping resistance and the wear resistance constant and stable even when the wear of the coating film gradually advances.

In the sliding member according to the present invention, the white hard carbon layer has an $sp^2/sp^3$ ratio of 0.2 to 0.7, and the black hard carbon layer has an $sp^2/sp^3$ ratio lower than the $sp^2/sp^3$ ratio of the white hard carbon layer and the $sp^2/sp^3$ ratio is 0.05 to 0.3. According to this invention, the white hard carbon layers having low density and excellent in chipping resistance and the black hard carbon layers having high density and high strength have an $sp^2/sp^3$ ratio within the above-described range and, because the inclined region and the homogeneous region are configured by such white hard carbon layers and black hard carbon layers, the sliding member exhibits constant and stable chipping resistance and wear resistance, and is excellent in peeling resistance (adhesion).

In the sliding member according to the present invention, when a cross section thereof is observed by a bright-field TEM image, a hard carbon base film relatively shown in white is provided between the base material or a base film provided on the base material, and the coating film.

In the sliding member according to the present invention, when a cross section thereof is observed by a bright-field TEM image, a hard carbon surface film relatively shown in white is provided on the coating film.

In the sliding member according to the present invention, the sliding member is preferably a piston ring.

A coating film according to the present invention is a coating film having, when a cross section thereof is observed by a bright-field TEM image, a thickness within a range of 1 μm to 50 μm, and configured by repeating units including black hard carbon layers, relatively shown in black, and white hard carbon layers, relatively shown in white, and laminated in a thickness direction.

The coating film includes an inclined region where thicknesses of the white hard carbon layers of the repeating units gradually increase in a thickness direction, and a homogeneous region, provided on the inclined region, where thicknesses of the white hard carbon layer of the repeating units are the same or substantially the same in the thickness direction. The inclined region has a form grown into a V-shape or a radial pattern in the thickness direction, and the homogeneous region does not have a form grown into a V-shape or a radial pattern in the thickness direction.

According to this invention, in the same way as described above, the coating film includes the inclined region where the thicknesses of the white hard carbon layers of the repeating units gradually increase (thicken) in the thickness direction and thus, due to the existence of the inclined region, can be firmly adhered to the base material of the sliding member to increase adhesion. In particular, the inclined region has a form grown into a V-shape or a radial pattern in the thickness direction that is not found in the homogeneous region. Thus, a V-shaped or a radial structure and the black hard carbon layers are intertwined and adhesion increases, making it possible to improve peeling resistance (adhesion). Further, on the inclined region, the thicknesses of the white hard carbon layers of the repeating units include the same or substantially the same homogeneous region in the thickness direction. Thus, due to the existence of the homogeneous region, the chipping resistance and the wear resistance can be exhibited in a stable and constant state, even when the wear of the coating film gradually advances. Such a coating film can be preferably applied to a coating film having a thickness of at least several μm, for example, particularly as a sliding member such as a piston ring to which a high load is applied.

Effect of the Invention

According to the present invention, it is possible to provide a sliding member including a coating film exhibiting constant and stable chipping resistance and wear resistance and excellent in peeling resistance (adhesion), and the coating film thereof, particularly as a sliding member such as a piston ring to which a high load is applied, and a coating film.

EMBODIMENTS OF THE INVENTION

The following describes a coating film and a piston ring according to the present invention in detail with reference to the drawings. It should be noted that the present invention is not limited only to the following descriptions and drawings and modifications within the scope of the gist are also included.

[Coating Film]

Figure 1:
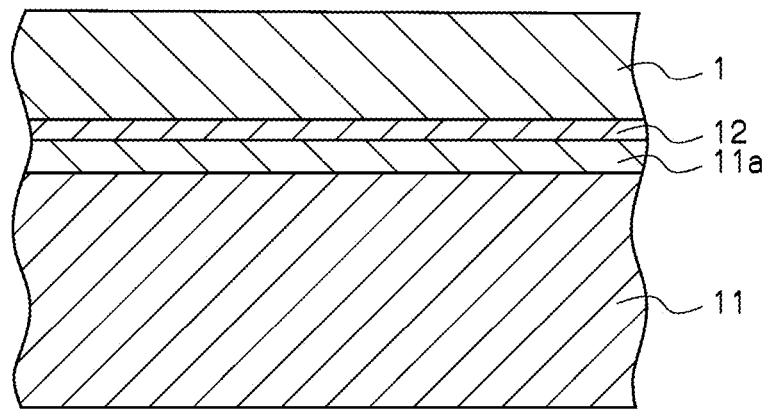
FIG. 1 is a schematic sectional view illustrating an example of a coating film provided to a sliding member according to the present invention.
Figure 2:
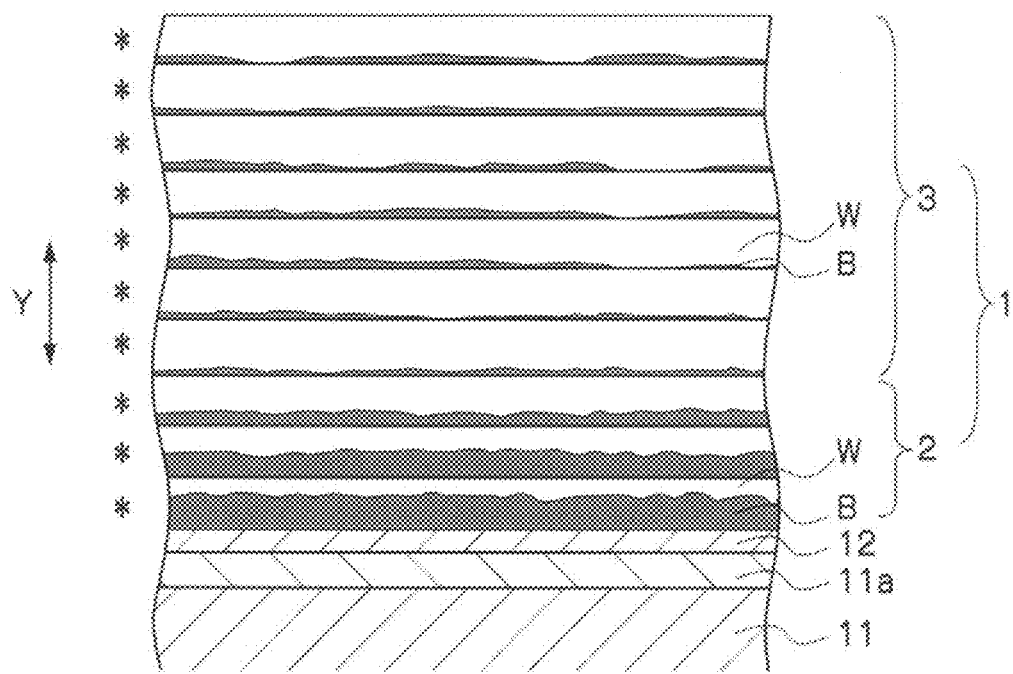
FIG. 2 is an explanatory view of an inclined region and a homogeneous region constituting the coating layer.
Figure 3:
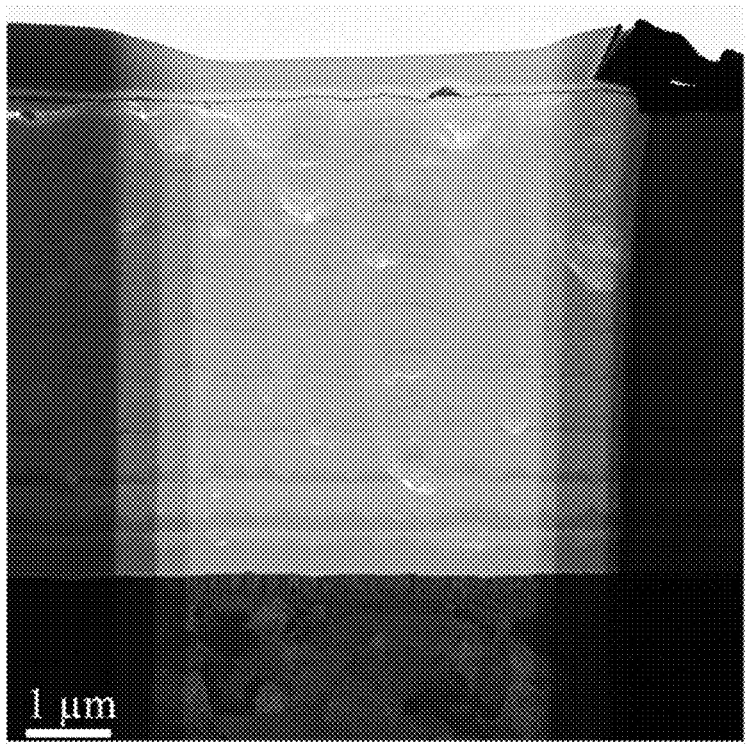
FIG. 3 is a bright-field TEM image of a cross section showing an example of the coating film.
Figure 5:
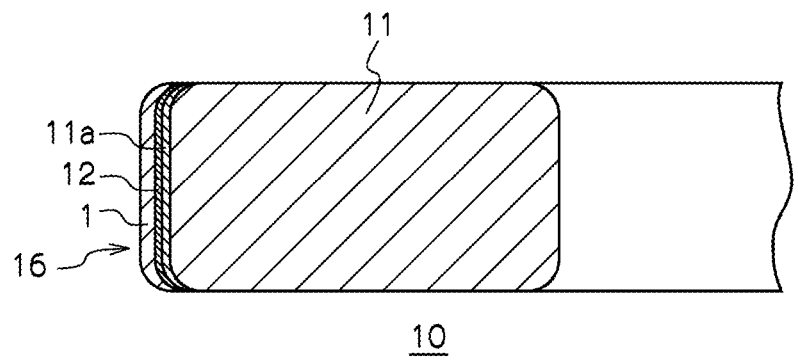
FIG. 5 is a schematic sectional view illustrating an example of a piston ring including the coating film.

A sliding member 10 according to the present invention is, for example, the sliding member 10 including a coating film 1 composed of a hard carbon layer on a sliding surface 16, as illustrated in the example of a piston ring in FIG. 5. As illustrated in FIG. 1 to FIG. 3, the coating film 1 has, when a cross section thereof is observed by a bright-field transmission electron microscope (TEM) image, a thickness within a range of 1 μm to 50 μm, and is configured by repeating units (indicated by an asterisk (*) in FIG. 2) including black hard carbon layers B, relatively shown in black, and white hard carbon layers W, relatively shown in white, and laminated in a thickness direction Y. The coating film 1 includes an inclined region 2, provided on a base material part side, where thicknesses of the white hard carbon layers W of the repeating units gradually increase (can also be regarded as "thicken"; hereinafter the same) in the thickness direction Y, and a homogeneous region 3, provided on a surface side, where thicknesses of the white hard carbon layers W of the repeating units are the same or substantially the same in the thickness direction Y. Then, the inclined region 2 has a form grown into a V-shape or a radial pattern in the thickness direction Y, and the homogeneous region 3 does not have a form grown into a V-shape or a radial pattern in the thickness direction Y.

In this sliding member 10, the relatively white hard carbon layers W each have low density and a high $sp^2/sp^3$ ratio, and are excellent in low frictionality and chipping resistance, and the relatively black hard carbon layers B each have high density and a low $sp^2/sp^3$ ratio, and are excellent in strength. According to this sliding member 10, the coating film 1 includes the inclined region 2, on the base material side thereof, where the thicknesses of the white hard carbon layers W of the repeating units gradually increase (thicken) in the thickness direction Y and the thicknesses of the black hard carbon layers B gradually decrease (thin) in the thickness direction Y and thus, due to this inclined region 2 where a large number of black hard carbon layers B having particularly high strength exist on the base material side, can be firmly adhered to the base material to increase adhesion. In particular, the inclined region 2 has a form grown into a V-shape or a radial pattern in the thickness direction Y that is not found in the homogeneous region 3. Thus, a V-shaped or a radial structure and the black hard carbon layers B are intertwined and adhesion increases, making it possible to improve peeling resistance (adhesion). Further, the coating film 1 includes the homogeneous region 3, on the surface side, where the thicknesses of the white hard carbon layers W of the repeating units are the same or substantially the same in the thickness direction Y. Thus, due to the existence of this homogeneous region 3 of the white hard carbon layers W particularly excellent in frictionality and chipping resistance, the chipping resistance and the wear resistance can be exhibited in a stable and constant state, even when the wear of the coating film 1 gradually advances. In this way, the sliding member 10 includes the coating film 1 exhibiting constant and stable chipping resistance and wear resistance and excellent in peeling resistance (adhesion).

It should be noted that the bright-field TEM image can be obtained by observing the coating film 1 thinned using a focused ion beam (FIB) through a TEM at an acceleration voltage of 300 kV, for example. The thickness direction Y refers to the direction in which the coating film 1 is sequentially laminated on a base material 11.

The following describes the components of the sliding member in detail. It should be noted that while, in the following, descriptions are often made with a piston ring used as an example of the sliding member, the sliding member according to the present invention is not limited to the piston ring.

(Base Material)

The base material 11 is a target member on which the coating film 1 is provided, as illustrated in FIG. 1 and FIG. 2. Examples of the base material 11, while not particularly limited, include a ferrous metal, a non-ferrous metal, ceramic, a hard composite material, and the like. Examples include carbon steel, alloy steel, quenched steel, high-speed tool steel, cast iron, aluminum alloy, magnesium alloy, cemented carbide, and the like. It should be noted that, in consideration of the film-forming temperature of the coating film 1, a base material having properties that do not significantly deteriorate at a temperature exceeding 200° C. is preferred.

Examples of the piston ring base material 11 when the coating film 1 is applied to the piston ring 10 include various materials used as the base material of the piston ring 10, and the material is not particularly limited. For example, various steel materials, stainless steel materials, casting materials, cast steel materials, and the like can be applied. Among these, examples include a martensitic stainless steel, a chromium-manganese steel (SUP5 material), a chrome vanadium steel (SUP10 material), a silicon chromium steel (SWOSC—V material), and the like. This base material 11 may include an underlayer 11a illustrated in FIG. 1 as necessary. Examples of such an underlayer 11a include an underlayer or the like that increases the adhesion with an intermediate layer 12 described later, and the underlayer is not particularly limited.

The piston ring base material 11 may be provided with a layer composed of nitride, carbonitride, carbide, or the like, containing at least one of Cr, Ti, Si, or Al, and the like as the underlayer 11a in advance. Examples of such a compound layer include CrN, TiN, CrAlN, TiC, TiCN, TiAlSiN, and the like. Among these, preferable examples include a nitrided layer (not illustrated) formed by performing nitriding treatment, and an wear-resistant film (not illustrated) such as a Cr—N based, a Cr—B—N based, or a Ti—N based film. Furthermore, among these, a Cr—N based, a Cr—B—N based, a Ti—N based wear-resistant film, or the like is preferably formed. It should be noted that the piston ring 10 exhibits excellent wear resistance even without such a nitriding treatment or formation of a Cr or Ti based wear-resistant film, and thus the nitriding treatment and formation of the Cr or Ti based wear-resistant film are not necessarily required.

The piston ring base material 11 may be pretreated as necessary. Such a pretreatment is preferably performed by polishing the surface to adjust surface roughness. Adjustment of the surface roughness is preferably performed by, for example, methods such as lapping and polishing the surface of the piston ring base material 11 using diamond abrasive grains. Such a piston ring base material 11 can be preferably applied as a pretreatment before formation of the intermediate layer 12 and the like described later, or as a pretreatment for the underlayer 11a and the like provided in advance before formation of the intermediate layer 12 and the like.

(Intermediate Layer)

The intermediate layer 12 is preferably provided as necessary between the base material 11 and the coating film 1, as illustrated in FIG. 1 and FIG. 2. This intermediate layer 12 can further improve the adhesion between the base material 11 and the coating film 1 and, when the coating film 1 is worn, the exposed intermediate layer 12 can exhibit an wear-resistant function.

Examples of the intermediate layer 12 include a layer containing at least one or two or more elements such as Cr, Ti, Si, W, and B. It should be noted that the underlayer 11a composed of a compound such as nitride, carbonitride, or carbide, and including at least one or two or more elements such as Cr, Ti, Si, or Al, may be provided below the intermediate layer 12 (between the base material 11 and the intermediate layer 12). Examples of such a compound include CrN, TiN, CrAlN, TiC, TiCN, TiAlSiN, and the like. It should be noted that the underlayer 11a provided with the intermediate layer 12 as necessary can be formed by means such as a vacuum depositing method or an ion plating method for setting the base material 11 into a chamber, creating a vacuum in the chamber, subsequently performing pre-heating, ion cleaning, and the like, and introducing an inert gas, for example.

Examples of the intermediate layer 12 when the coating film 1 is applied to the piston ring 10 include a titanium film, a chromium film, or the like. The intermediate layer 12 in this case may not also necessarily be provided, and thus formation is optional. The intermediate layer 12 composed of a titanium film, a chromium film, or the like can be formed by various film-forming means such as a vacuum depositing method, a sputtering method, and an ion plating method. For example, formation can be performed by setting the piston ring base material 11 into a chamber, creating a vacuum in the chamber, subsequently performing pre-heating, ion cleaning, and the like, and introducing an inert gas. While a thickness of the intermediate layer 12 is not particularly limited, a thickness within a range of 0.05 µm to 2 µm, inclusive, is preferred. It should be noted that, while the intermediate layer 12 is preferably formed on at least the outer peripheral sliding surface 16 on which sliding occurs upon contact by the piston ring 10 with a cylinder liner (not illustrated), the intermediate layer 12 may be formed on other surfaces, such as an upper surface, a lower surface, or an inner peripheral surface of the piston ring 10, for example.

This intermediate layer 12 may be directly formed on the piston ring base material 11, or may be formed on the above-described surface after the nitriding treatment, or on the underlayer 11a composed of an wear-resistant film. The intermediate layer 12 can improve the adhesion between the piston ring base material 11 and the coating film 1. It should be noted that, in order to improve the adhesion and the like between the intermediate layer 12 and the coating film 1 as well, another layer may be provided as needed. For example, a film having the same or substantially the same components as the coating film 1 described later may be formed.

(Coating Film)

Figure 4:
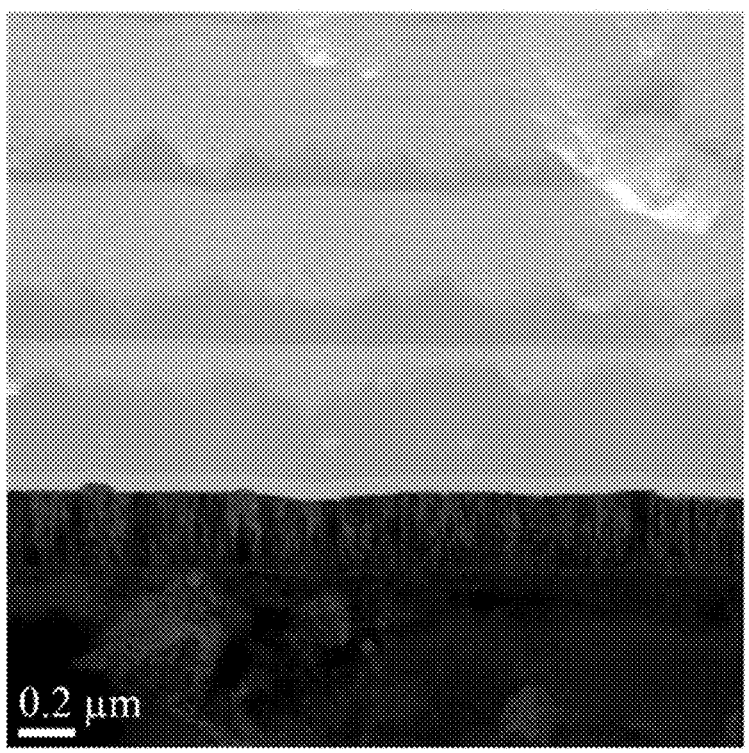
FIG. 4 is a bright-field TEM image of the inclined region.

As shown in FIG. 2 to FIG. 4, the coating film 1 includes two types of hard carbon layers (W, B) relatively shown in the two colors white and black when a bright-field TEM image of the cross section is observed. The white hard carbon layers W and the black hard carbon layers B are alternately laminated. Then, this coating film 1 includes the inclined region 2, provided on the base material part side, where thicknesses of the white hard carbon layers W of the repeating units gradually increase in the thickness direction Y, and the homogeneous region 3, provided on the surface side, where thicknesses of the white hard carbon layers W of the repeating units are the same or substantially the same in the thickness direction Y.

When the coating film 1 is applied to the piston ring 10, the coating film 1 is formed on at least the outer peripheral sliding surface 16 on which the piston ring 10 slides upon contact with a cylinder liner (not illustrated), as illustrated in FIG. 5. It should be noted that the coating film 1 may be optionally formed on other surfaces, such as the upper surface, the lower surface, and the inner peripheral surface of the piston ring 10 as well, for example.

The white hard carbon layers W that are relatively white each have a high $sp^2/sp^3$ ratio. The $sp^2/sp^3$ ratio is preferably 0.2 to 0.7, and more preferably 0.3 to 0.6. The reason that this hard carbon layers W appear relatively white is that the $sp^2/sp^3$ ratio is high. With the $sp^2/sp^3$ ratio within this range, it is possible to achieve a white hard carbon layer having low density and excellent in low frictionality and chipping resistance. It should be noted that $sp^2$ and $sp^3$ can be measured by a TEM-EELS obtained by combining electron energy-loss spectroscopy (EELS) with a TEM. The black hard carbon layers B can also be measured in this same way. Further, "low density" means that the density is relatively low compared to that of the black hard carbon layers B that are relatively black.

The relatively black hard carbon layers B each have an $sp^2/sp^3$ ratio lower than that of the white hard carbon layers B, and the $sp^2/sp^3$ ratio is 0.05 to 0.3 and preferably 0.1 to 0.25. The reason that this hard carbon layers B appear relatively black is that the $sp^2/sp^3$ ratio is high. With the $sp^2/sp^3$ ratio within this range, the hard carbon layers B have high density and are excellent in strength. It should be noted that "high density" means that the density is relatively high compared to that of the white hard carbon layers W that are relatively white.

The inclined region 2 is a region where the thicknesses of the white hard carbon layers W of the repeating units having a $sp^2/sp^3$ ratio within the above-described range gradually increase in the thickness direction Y of the coating film 1, and the black hard carbon layers B having a $sp^2/sp^3$ ratio within the above-described range gradually decrease in the thickness direction Y of the coating film 1. For example, as shown in FIG. 4, given 1 as a thickness of the repeating unit, in the hard carbon layer initially provided on the intermediate layer 12, a white hard carbon layer W having a thickness of approximately 0.3 is provided on a black hard carbon layer B having a thickness of approximately 0.7. In the repeating unit above this repeating unit, a white hard carbon layer W having a thickness of approximately 0.6 is provided on a black hard carbon layer B having a thickness of approximately 0.4. Furthermore, in the repeating unit above this, a white hard carbon layer W having a thickness of approximately 0.8 is provided on a black hard carbon layer B having a thickness of approximately 0.2. Thus, the ratio of the thickness of the black hard carbon layer B to the white hard carbon layer W in the inclined region 2 changes in the thickness direction Y of the coating film 1 and, as the repeating units are laminated, the thickness ratio of the black hard carbon layer B gradually decreases, and the thickness ratio of the white hard carbon layer W gradually increases. In such an inclined region 2, many black hard carbon layers B having particularly high strength exist on the base material side, making it possible to increase the adhesion with the base material 11 (the underlayer 11a and the intermediate layer 12, when provided).

In this inclined region 2, a boundary between the white hard carbon layer W and the black hard carbon layer B within each repeating unit is not a flat surface parallel to the surface of the coating film 1 or the base material 11, but a wave shape or triangular-wave shape. The reason is that, when the hard carbon layer of a repeating unit is formed, the black hard carbon layer B initially formed has a growth rate that is not the same across the entire surface, the boundary readily grows into a wave shape or a triangular-wave shape and, in this case, the white hard carbon layer W is formed on such a black hard carbon layer B. As a result, the boundary between the black hard carbon layer B and the white hard carbon layer W is considered to have a wave shape or a triangular-wave shape such as shown in FIG. 2 to FIG. 4.

In the inclined region 2, the white hard carbon layers W may have a three-dimensional growth form that can be described as a mesh, a scale, a dendrite, or a layer. With such a growth form, the white hard carbon layers W may contain black hard carbon. Further, the triangular-wave form of the white hard carbon layers W can also be seen as a V-shape (a form that widens from the position of the pivot of the fan toward the end) or a radial direction with respect to the growth direction of the film.

When a bright-field TEM image of the cross section of the laminated film is observed under an acceleration voltage of 200 to 300 kV, which is a condition normally adopted in a bright-field TEM, in this inclined region 2, the white hard carbon layers W are grown on the black hard carbon layers B into a V-shape or a radial pattern in the thickness direction Y of the laminated film. The V-shaped or radial form structure and the black hard carbon layer B are intertwined, resulting in high adhesion. Such a form structure is substantially not found in the homogeneous region 3 provided on the surface side.

The homogeneous region 3 is a region where the thicknesses of the white hard carbon layers W of the repeating units having the $sp^2/sp^3$ ratio within the above-described range, and the thicknesses of the black hard carbon layers B having the $sp^2/sp^3$ ratio within the above-described range are the same or substantially the same in the thickness direction Y of the coating film 1. For example, as shown in FIG. 3, given 1 as a thickness of the repeating unit, in each of the repeating units provided on the above-described inclined region 2, a white hard carbon layer W having a thickness of approximately 0.9 is provided on a black hard carbon layer B having a thickness of approximately 0.1. Thus, the ratios of the thicknesses of the black hard carbon layers B to the white hard carbon layers W in the homogeneous region 3 are the same or substantially the same in the thickness direction Y of the coating film 1. In such a homogeneous region 3, the white hard carbon layers W particularly excellent in low frictionality and chipping resistance exist in the same way in each repeating unit, and thus the chipping resistance and the wear resistance can be exhibited in a stable and constant state, even when the wear of the coating film 1 gradually advances.

In the homogeneous region 3, the ratios of the thicknesses of the black hard carbon layers B to the white hard carbon layers W (black thickness/white thickness) are substantially constant, and are preferably within a range of 0.01 to 0.3 in particular from the viewpoints of chipping resistance and wear resistance. In the homogeneous region 3, the thickness ratios of the black hard carbon layers B are low as within the above-described range, and a film with the white hard carbon layers W being rich is laminated.

In this homogeneous region 3, a boundary between the white hard carbon layer W and the black hard carbon layer B within each repeating unit is a flat surface relatively parallel to the surface of the coating film 1 and the base material 11, and a wave shape or a triangular-wave shape like the above-described inclined region 2 is not noticeable. The reason is that, unlike the case of the inclined region 2, because the thickness of the black hard carbon layer B initially formed is thin, the white hard carbon layer W starts forming before the black hard carbon layer B grows into a wave shape or a triangular-wave shape.

Further, in the homogeneous region 3, as shown in FIG. 2 and FIG. 3, the black hard carbon layers B are lower in ratio than the white hard carbon layers W and, when a cross section thereof is observed by a bright-field TEM image, the black hard carbon layers B may not be uniformly observed with a constant or substantially constant thickness in the in-plane direction (width direction). However, the black hard carbon layers B appear intermittently in the in-plane direction, at least to the extent that the repeating units can be distinguished.

The ratio of the homogeneous region 3 to the total thickness of the laminated film ("thickness of the homogeneous region 3+thickness of the inclined region 2") is preferably 0.5 to 0.9. The homogeneous region 3 occupies substantially the thickness of the entire laminated film, and thus the chipping resistance and the wear resistance can be exhibited in a stable and constant state due to the homogeneous region 3, even when the wear of the coating film 1 gradually advances. Further, the inclined region 2 firmly adheres the homogeneous region 3 having stable properties to the base material (which may include the underlayer 11a and the intermediate layer 12), making it possible to increase adhesion. As a result, it is possible to cause the inclined region 2 exhibiting constant and stable chipping resistance and wear resistance to be excellent in peeling resistance (adhesion). Such characteristics are particularly desirable for sliding members such as piston rings to which high loads are applied and coating films and, compared to sliding members that do not have the characteristics of the present invention, a sliding member exhibiting constant and stable chipping resistance and wear resistance and excellent in peeling resistance (adhesion) can be obtained.

The coating film 1 can be formed to a thickness within a range of more than 1 μm and 50 μm or less. The thick coating film 1 within the above-described range in which the white hard carbon layers W and the black hard carbon layers B are laminated can be formed by alternately carrying out film formation at 200° C. or less and film formation above 200° C. as the film-forming temperature (substrate temperature) in a PVD method. Film formation above 200° C. results in the white hard carbon layers W having a slightly high $sp^2/sp^3$ ratio. On the other hand, film formation at 200° C. or less results in the black hard carbon layers B having a slightly low $sp^2/sp^3$ ratio. The coating film 1 can be formed into a thick film within the above-described range by alternately laminating these films. As a result, the coating film 1 exhibiting constant and stable chipping resistance and wear resistance and excellent in peeling resistance (adhesion) can be formed.

It should be noted that the thickness of each repeating unit of the hard carbon layer (the thickness of one layer of the laminated film) is preferably within a range of 0.1 to 4 μm. In these repeating units, the thicknesses of the black hard carbon layers B and the white hard carbon layers W change in an inclined manner within the above-described range in the inclined region 2, and are constant or substantially constant within the above-described range in the homogeneous region 3. It should be noted that a more preferred thickness is within a range of 0.3 to 1 μm.

The obtained coating film 1 is an amorphous carbon layer or an amorphous carbon layer partially containing graphite, has a low friction coefficient against a mated material, and has favorable wear resistance against a mated material.

It should be noted that, as shown in FIG. 3, in the coating film 1, a raised shape that extends across at least two or more laminated layers may appear. This raised shape is a portion seen as a form with a stratum raised, and as a particle or balloon shape as well. When the raised shape exists, the coating film 1 is not aligned in the thickness direction Y or uniformly laminated, and thus the raised shape readily appears mainly in the upper half and the laminated state is seen as disarranged. However, the properties such as wear resistance and chipping resistance are not significantly affected. The formation mechanism of the raised shape is not clear at this time, but it is conceivable that macro particles during film formation serve as the starting point.

The hard carbon layers, that is, both the white hard carbon layers W and the black hard carbon layers B, constituting the coating film 1 may contain, in addition to carbon, hydrogen within a range of 0.1 atom % or more and 10 atom % or less, and preferably 8 atom % or less. The hydrogen content can be measured by hydrogen forward scattering (HFS) analysis, and preferably the remnant is substantially carbon only and does not contain impurities other than N, B, Si, and other inevitable impurities. It should be noted that, in the white hard carbon layers W, even when these elements are contained, chipping resistance can be improved. On the other hand, in the black hard carbon layers B, when the remnant is substantially carbon only, hardness increases and wear resistance improves, and thus it is preferable. "Substantially carbon only" means that impurities other than N, B, Si and other inevitable impurities are not contained.

(Formation of Coating Film)

The coating film 1 can be formed by applying a PVD method such as an arc-type PVD method or a sputtering PVD method. Among these, formation by an arc ion plating method that uses a carbon target and does not contain hydrogen atoms in the film-forming raw material is preferred.

Figure 6:
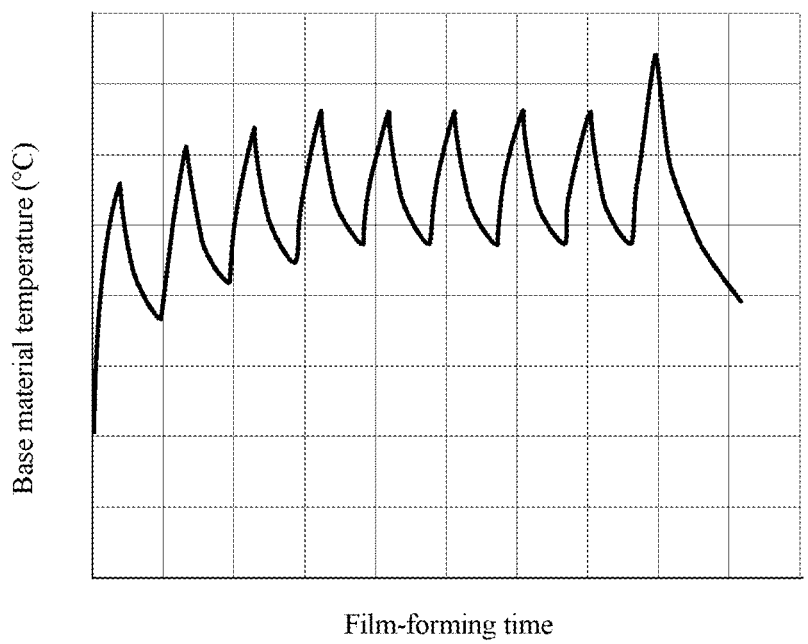
FIG. 6 is a graph showing changes in a base material temperature when forming a hard carbon layer.

When the coating film 1 is formed by an arc ion plating method, preferably the bias voltage or the arc current is regulated, the base material is heated by a heater, or a cooling mechanism is introduced into a jig (holder), which sets the base material, to forcibly cool the base material. As an example, the base material temperature is controlled as shown in FIG. 6 and the furnace pressure and the like are controlled, thereby forming the coating film 1 with the hard carbon layers having different $sp^2/sp^3$ ratios (white hard carbon layers W and black hard carbon layers B) alternately laminated.

In order to form the black hard carbon layer B having an $sp^2/sp^3$ ratio of 0.05 to 0.3, the film is formed at a base material temperature that is more than 50° C. and 200° C. or less. To alternately laminate the black hard carbon layers B and the white hard carbon layers W, a method for introducing a cooling step after forming the white hard carbon layer W to decrease the base material temperature, and then forming black hard carbon layers B once the base material temperature is 200° C. or less and the like, can be adopted.

In order to form the white hard carbon layer W having an $sp^2/sp^3$ ratio of 0.2 to 0.7, control is performed so that the base material temperature is more than 200° C. and 300° C. or less, and more preferably 220° C. to 275° C. The base material temperature is preferably controlled by adjusting the bias voltage to −50 V to −400 V, but can be controlled by changing the arc current, heating by a heater, or cooling from the holder. Accordingly, the control of the base material temperature is not particularly limited to controlling the bias voltage only.

The base material temperature can be controlled by adjusting items other than the bias voltage as well, such as the arc current, the heater temperature, and the furnace pressure, and thus the control of the base material temperature is not particularly limited to controlling the bias voltage. However, it becomes difficult to form a mesh-patterned hard carbon layer when the voltage is more than −50 V and, on the other hand, when the voltage is less than −400 V as well, and thus a voltage of −50 to −400 V is preferred. Further, when the furnace pressure is $10^4$ to $5 \times 10^4$ Pa in a vacuum atmosphere, a hard carbon layer having low friction and high wear resistance compared to a case where hydrogen gas or nitrogen gas is introduced can be obtained, and thus it is preferable.

($sp^2/sp^3$ Ratio)

A "hard carbon layer" is a film in which carbon-bonding $sp^2$ bonds represented by graphite and carbon-bonding spa bonds represented by diamond coexist. Here, by electron energy-loss spectroscopy (EELS) analysis, 1s→π* intensity and 1s→σ* intensity are measured and, with 1s→π* intensity regarded as $sp^2$ intensity and 1s→σ* intensity regarded as spa intensity, the ratio of 1s→π* intensity to 1s→σ* intensity is calculated as the $sp^2/sp^3$ ratio. Accordingly, the $sp^2/sp^3$ ratio in the present invention, to be exact, refers to the π/σ intensity ratio. Specifically, a spectral imaging method in a STEM (scanning TEM) mode is applied and, under the conditions of an acceleration voltage of 200 kv, a sample absorption current of $10^{-9}$ A, and a beam spot size diameter of 1 nm, EELSs obtained at a pitch of 1 nm are integrated, a C—K absorption spectrum is extracted as average information from a region of approximately 10 nm, and the $sp^2/sp^3$ ratio is calculated.

EXAMPLES

The following describes the coating film and the sliding member according to the present invention in further detail using examples and reference examples.

Example 1

A piston ring was applied as the sliding member 10. On the piston ring base material 11 (88-mm diameter, 2.9-mm ring-width in the radial direction, 1.2-mm ring-width in the axial direction) composed of C: 0.65 mass %, Si: 0.38 mass %, MN: 0.35 mass %, Cr: 13.5 mass %, Mo: 0.3 mass %, P: 0.02 mass %, S: 0.02 mass %, remnant: iron and inevitable impurities, a nitrided layer of 40 μm was formed by nitriding treatment, and a metallic chromium layer having a thickness of 0.2 μm was formed as the intermediate layer 12 by an ion plating method. Then, on the intermediate layer 12, repeating units of the inclined region 2 and the homogeneous region 3 were formed into a film using an arc ion plating device with a carbon target to obtain the coating film 1.

In film formation of the inclined region 2, a black hard carbon layer B and a white hard carbon layer W having a total film thickness of approximately 0.5 μm, which is a first repeating unit, were formed by performing arc discharge at a bias voltage of −700 V and an arc current of 40 A for five minutes, subsequently performing arc discharge at a bias voltage of −170 V and an arc current of 40 A and heating by a heater, and executing film formation for 2,100 seconds while the base material temperature was increased from approximately 80° C. to 210° C. Then, arc discharge was stopped at a bias voltage of 0 V and an arc current of 0 A, and cooling was performed to approximately 140° C. for 3,600 seconds.

Next, a black hard carbon layer B and a white hard carbon layer W having a total film thickness of approximately 0.5 μm, which is a second repeating unit, were formed by performing arc discharge at a bias voltage of −1,000 V and an arc current of 40 A for 90 seconds to form an adhesion layer composed of white hard carbon, subsequently performing arc discharge at a bias voltage of −170 V and an arc current of 40 A and heating by a heater, and executing film formation for 2,100 seconds while the temperature was increased from approximately 140° C. to 230° C. Then, arc discharge was stopped at a bias voltage of 0 V and an arc current of 0 A, and cooling was performed to approximately 160° C. for 3,600 seconds.

Next, a black hard carbon layer B and a white hard carbon layer W having a total film thickness of approximately 0.5 μm, which is a third repeating unit, were formed by performing arc discharge at a bias voltage of −1,000 V and an arc current of 40 A for 90 seconds to form an adhesion layer composed of white hard carbon, subsequently performing arc discharge once again at a bias voltage of −170 V and an arc current of 40 A and heating by a heater, and executing film formation for 2,100 seconds while the temperature was increased from approximately 160° C. to 240° C. Then, arc discharge was stopped at a bias voltage of 0 V and an arc current of 0 A, and cooling was performed to approximately 170° C. for 3,600 seconds. In this way, three repeating units constituting the inclined region 2 having a total thickness of approximately 1.5 μm were formed into a film.

In film formation of the homogeneous region 3, after formation of the inclined region 2, a black hard carbon layer B and a white hard carbon layer W having a total film thickness of approximately 0.5 μm, which is a first (fourth in total) repeating unit, were formed by performing arc discharge at a bias voltage of −1,000 V and an arc current of 40 A for 90 seconds to form an adhesion layer composed of white hard carbon, subsequently performing arc discharge once again at a bias voltage of −170 V and an arc current of 40 A and heating by a heater, and executing film formation for 2,100 seconds while the temperature was increased from approximately 180° C. to 250° C. Then, arc discharge was stopped at a bias voltage of 0 V and an arc current of 0 A, and cooling was performed to approximately 180° C. for 3,600 seconds. Subsequently, this film formation and cooling cycle was further repeated five times to form the homogeneous region 3 having a total thickness of 2.5 μm and configured by six repeating units. The total film thickness was approximately 4.2 μm.

After formation of the homogeneous region 3, a conforming layer with coating processability improved was formed. The conforming layer, composed of a black hard carbon layer B and a white hard carbon layer W having a film thickness of approximately 0.5 was formed by performing arc discharge at a bias voltage of −1,000 V and an arc current of 40 A for 90 seconds to form an adhesion layer composed of white hard carbon, subsequently performing arc discharge once again at a bias voltage of −300 V and an arc current of 40 A and heating by a heater, and executing film formation for 2,100 seconds while the temperature was increased from approximately 180° C. to 280° C. The total thickness, including this conforming layer, was approximately 4.7 μm.

[Evaluation]

Bright-field TEM images of the cross section of the coating film 1 thus formed were taken. As shown in FIG. 3 and FIG. 4, in the coating film 1, it could be confirmed that the white hard carbon layers W, relatively shown in white, and the black hard carbon layers B, relatively shown in black, are alternately laminated in the thickness direction. Further, it could be confirmed that the coating film 1 includes the inclined region 2, provided on the base material side and configured by three repeating units, where thicknesses of the white hard carbon layers W gradually increase in the thickness direction Y, and the homogeneous region 3, provided on the surface side and configured by six repeating units, where thicknesses of the white hard carbon layers W are the same or substantially the same in the thickness direction Y. Furthermore, the $sp^2/sp^3$ ratio was within the range of 0.2 to 0.7 in each portion of the white hard carbon layers W, and within the range of 0.05 to 0.3 in each portion of the black hard carbon layers B. The same held true for the conforming layer when formed on the uppermost surface.

[Observation of Structural Form]

Cross-sectional images of the coating film 1 described above were obtained by taking images of the cross section of the coating film 1 using a bright-field TEM at an acceleration voltage of 200 kV. Further, the total thickness of the coating film 1 and the thicknesses of the white hard carbon layers W and the black hard carbon layers B were found from the bright-field TEM images. For the thickness measurement, a piston ring with the coating film 1 formed near a center of an effective coating range of a used arc ion plating device, and a piston ring with the coating film 1 formed near an upper end and a lower end were adopted as measurement samples. The ratios of the obtained thicknesses of the black hard carbon layers B to the thicknesses of the white hard carbon layers W (black thickness/white thickness) were calculated and are shown in Table 1. From Table 1, the inclined region 2 in which the thicknesses of the black hard carbon layers B gradually decrease, and the ratios thereof (black thickness/white thickness) gradually decrease in the thickness direction in which the layers are sequentially laminated could be confirmed in each of the samples as well. Furthermore, after confirmation of the inclined region 2, the homogeneous region 3 in which the thicknesses of the black hard carbon layers B and the thicknesses of the white hard carbon layers W are the same or substantially the same in the thickness direction, and the ratios thereof (black thickness/white thickness) fall within the range of 0.01 to 0.3 could be confirmed.

TABLE 1

| Order of laminated direction | Ratio (black thickness/white thickness) | | | |
|---|---|---|---|---|
| | Near upper end | Near center | Near lower end | |
| First layer | 4.15 | 0.92 | 5.17 | Inclined region |
| Second layer | 0.53 | 0.44 | 0.55 | |
| Third layer | 0.40 | 0.33 | 0.44 | |
| Fourth layer | 0.24 | 0.13 | 0.26 | Homogeneous region |
| Fifth layer | 0.24 | 0.16 | 0.24 | |
| Sixth layer | 0.09 | 0.10 | 0.10 | |
| Seventh layer | 0.10 | 0.08 | 0.09 | |
| Eighth layer | 0.12 | 0.09 | 0.14 | |
| Ninth layer | 0.16 | 0.09 | 0.12 | |

[Wear Resistance, Chipping Resistance, Low Frictionality, and Peeling Resistance]

Figure 7:
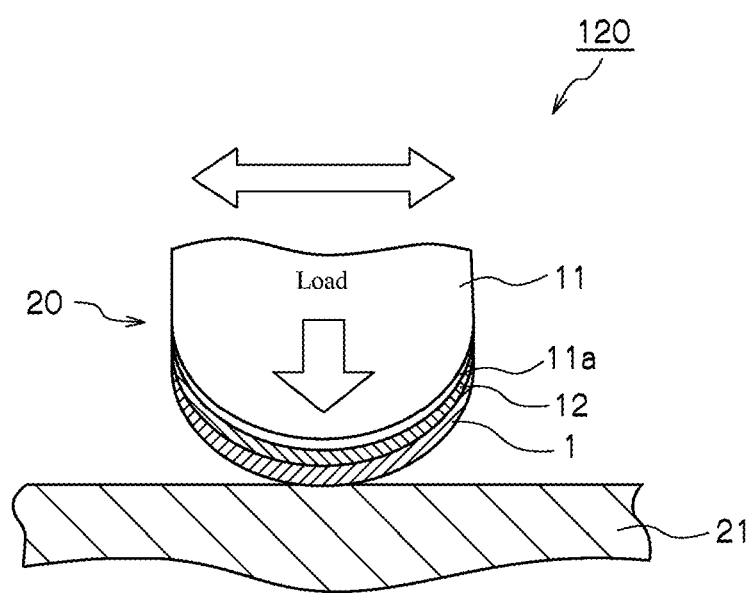
FIG. 7 is a schematic view of a friction-wear testing method by an SRV tester.

Various properties of the formed coating film 1 were obtained by a friction-wear testing method using a Schwingungs Reihungd and Verschleiss (SRV) tester 120 generally used in the evaluation of sliding members for automobiles. Specifically, with a sliding surface of a friction-wear test sample 20 in contact with SUJ2 material serving as a sliding object 21 as illustrated in FIG. 7, the friction-wear test sample 20 was reciprocally slid for 10 minutes (refer to the image of FIG. 8A) and for 60 minutes (refer to the image of FIG. 8B) at each load while applying a load of 1,000 N, using 5W-30 (Mo-DTC free) as the lubricant, and the sliding surface thereof was observed under a microscope. In FIG. 7, reference numeral 12 denotes the intermediate layer, and reference numeral 1 denotes the coating film. The observation results are shown in FIGS. 8A and 8B.

Figure 8A:
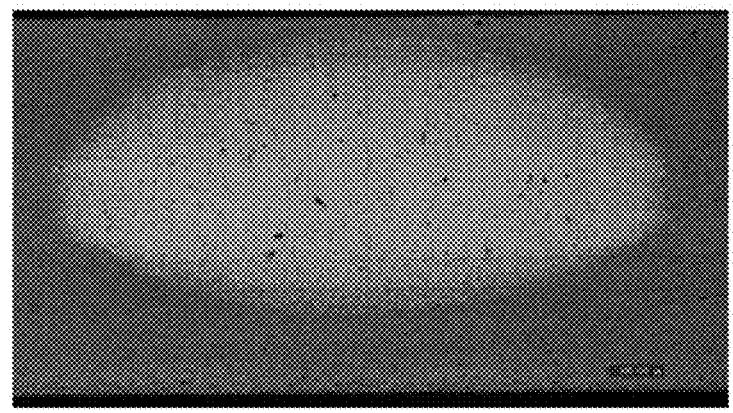
FIGS. 8A and 8B are microscope images showing friction-wear test results of Example 1.
Figure 8B:
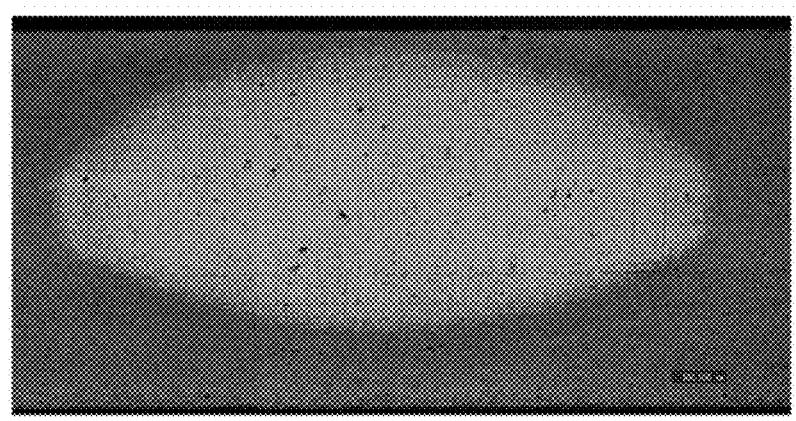

From the results of FIGS. 8A and 8B, it was confirmed that the obtained coating film 1 was free of peeling and chipping as well, and included a coating film exhibiting constant and stable chipping resistance and wear resistance and excellent in peeling resistance (adhesion). Further, the SRV test when a conforming layer was formed on the uppermost surface also achieved similar results. The coating film with the conforming layer formed could be confirmed to achieve a shortening of a processing time for obtaining a desired surface roughness relative to the coating film not with the conforming layer formed, and excellent processability.

In the coating film 1 obtained in this test, the chipping resistance and the wear resistance can be exhibited in a stable and constant state due to the homogeneous region 3, even when the wear of the coating film 1 gradually advances and, because the aggression against the mated material is also constant and stable, the sliding properties are stable with respect to both the coating film 1 and the mated material. Further, in the inclined region 2, the homogeneous region 3, which stabilizes sliding properties, is firmly adhered to the base material (which may include the underlayer 11a and the intermediate layer 12) to increase adhesion, and thus the inclined region 2 is excellent in peeling resistance (adhesion). Such characteristics are particularly desirable for sliding members such as piston rings to which high loads are applied and coating films and, compared to sliding members that do not have these characteristics, a sliding member exhibiting constant and stable chipping resistance and wear resistance and excellent in peeling resistance (adhesion) can be obtained. On the other hand, when the entire laminated film is the homogeneous region 3 and the inclined region 2 does not exist, the adhesion with the base material is insufficient and the effect of the present invention is not achieved. Furthermore, when the entire laminated film is the inclined region 2 and the homogeneous region 3 does not exist, the black hard carbon layers B having high strength gradually increase in number, the aggression against the mated material gradually increases, and the sliding properties (chipping resistance and wear resistance) are insufficient in terms of securing constancy and stability when wear gradually advances.

While the above has described the present invention on the basis of embodiments, the present invention is not limited to the embodiments described above. Various changes can be made to the embodiments described above within the same scope as and equivalent scope to the present invention.

DESCRIPTIONS OF REFERENCE NUMERALS

1 Coating film
2 Inclined region
3 Homogeneous region
11 Base material (Piston ring base material)
11a Underlayer
12 Intermediate layer
16 Sliding surface
20 Friction-wear test sample
21 Sliding object
120 SRV tester
B Black hard carbon layer
W White hard carbon layer
Y Thickness direction

What is claimed is:

1. A sliding member comprising:
    a coating film composed of a hard carbon layer on a sliding surface,
    the coating film having, when a cross section thereof is observed by a bright-field TEM image, a thickness within a range of 1 μm to 50 μm, and configured by repeating units including black hard carbon layers, relatively shown in black, and white hard carbon layers, relatively shown in white, and laminated in a thickness direction, and
    the coating film including
    an inclined region, provided on a base material side, where thicknesses of the white hard carbon layers of the repeating units gradually increase in a thickness direction, and
    a homogeneous region, provided on a surface side, where thicknesses of the white hard carbon layers of the repeating units are the same or substantially the same in the thickness direction,
    the inclined region having a form grown into a V-shape or a radial pattern in the thickness direction, and
    the homogeneous region not having a form grown into a V-shape or a radial pattern in the thickness direction.

2. The sliding member according to claim 1, wherein
    a thickness ratio of the black hard carbon layer to the white hard carbon layer (black thickness/white thickness) in the homogeneous region is 0.01 to 0.3.

3. The sliding member according to claim 1, wherein
    the white hard carbon layer has an $sp^2/sp^3$ ratio of 0.2 to 0.7, and the black hard carbon layer has an $sp^2/sp^3$ ratio lower than the $sp^2/sp^3$ ratio of the white hard carbon layer and the $sp^2/sp^3$ ratio is 0.05 to 0.3.

4. The sliding member according to claim 1, wherein, when a cross section thereof is observed by a bright-field TEM image, a hard carbon base film relatively shown in white is provided between the base material or a base film provided on the base material, and the coating film.

5. The sliding member according to claim 1, wherein, when a cross section thereof is observed by a bright-field TEM image, a hard carbon surface film relatively shown in white is provided on the coating film.

6. The sliding member according to claim 1, wherein the sliding member is a piston ring.

7. A coating film having, when a cross section thereof is observed by a bright-field TEM image, a thickness within a range of 1 μm to 50 μm, and configured by repeating units including black hard carbon layers, relatively shown in black, and white hard carbon layers, relatively shown in white, and laminated in a thickness direction, the coating film comprising:
    an inclined region where thicknesses of the white hard carbon layers of the repeating units gradually increase in a thickness direction; and
    a homogeneous region, provided on the inclined region, where thicknesses of the white hard carbon layers of the repeating units are the same or substantially the same in the thickness direction,
    the inclined region having a form grown into a V-shape or a radial pattern in the thickness direction, and
    the homogeneous region not having a form grown into a V-shape or a radial pattern in the thickness direction.

* * * * *